United States Patent
Marchetti

(10) Patent No.: US 11,240,937 B2
(45) Date of Patent: Feb. 1, 2022

(54) MODULAR CHILLER FOR DATA CENTERS

(71) Applicant: UNIFLAIR S.p.A., Conselve (IT)

(72) Inventor: Daniele Marchetti, Chioggia (IT)

(73) Assignee: UNIFLAIR S.p.A., Conselve (IT)

( * ) Notice: Subject to any disclaimer, the term of this patent is extended or adjusted under 35 U.S.C. 154(b) by 220 days.

(21) Appl. No.: 16/403,896

(22) Filed: May 6, 2019

(65) Prior Publication Data

US 2019/0350109 A1 Nov. 14, 2019

(30) Foreign Application Priority Data

May 10, 2018 (IT) .................. 102018000005247

(51) Int. Cl.
*G05D 23/00* (2006.01)
*H05K 7/20* (2006.01)

(52) U.S. Cl.
CPC ..... *H05K 7/20827* (2013.01); *H05K 7/20318* (2013.01); *H05K 7/20327* (2013.01)

(58) Field of Classification Search
CPC ............. H05K 7/2079; H05K 7/20827; H05K 7/20318; H05K 7/20327; H05K 7/208; H05K 7/20836; H05K 7/20218; H05K 7/20263; H05K 7/20272; H05K 7/20281; F25B 41/00; F25B 41/20; F25B 41/24; F25B 41/40; F25B 2400/21
See application file for complete search history.

(56) References Cited

U.S. PATENT DOCUMENTS

| 9,003,821 | B2* | 4/2015 | Malone | H05K 7/2079 |
| | | | | 62/259.2 |
| 2010/0078160 | A1 | 4/2010 | Novotny et al. | |
| 2011/0239671 | A1 | 10/2011 | Malone et al. | |
| 2018/0014434 | A1* | 1/2018 | Craft, Jr. | H05K 7/20736 |

OTHER PUBLICATIONS

Extended European Search Report from corresponding European Application No. 19173458.1 dated Sep. 30, 2019.
Italian Search Report and Written Opinion from corresponding Italian Application No. 201800005247 dated Jan. 25, 2019.

* cited by examiner

*Primary Examiner* — Henry T Crenshaw
*Assistant Examiner* — Kamran Tavakoldavani
(74) *Attorney, Agent, or Firm* — Lando & Anastasi, LLP

(57) ABSTRACT

A modular chiller system includes a switching and pumping module, one or more drycooler modules, and one or more chiller modules. The switching and pumping module, the one or more drycooler modules, and the one or more chiller modules share same water, power, and signal interfaces. The cooling capacity of the modular chiller system may be increased by adding drycooler modules or chiller modules without additional hydraulic and electrical infrastructures.

15 Claims, 18 Drawing Sheets

MODULAR CHILLER FOR DATA CENTERS

CROSS-REFERENCE TO RELATED APPLICATION

This application claims the benefit under 35 U.S.C. § 119 of Italian Patent Application No. 102018000005247 filed on May 10, 2018 which is hereby incorporated herein by reference in its entirety for all purposes.

BACKGROUND

1. Technical Field

Aspects and embodiments disclosed herein are directed generally to cooling systems for data centers and methods of constructing and operating same.

2. Discussion of Related Art

Centralized data centers for computer, communications, and other electronic equipment have been in use for a number of years, and more recently with the increasing use of the Internet, large scale data centers that provide hosting services for Internet Service Providers (ISPs), Application Service Providers (ASPSs), and Internet content providers are becoming more prevalent. Typical centralized data centers contain numerous racks of equipment that require power, cooling, and connections to external communications facilities. In modern data centers and network rooms, the increased density of computing equipment used in these facilities has put strains on the cooling and power systems of the facilities. In the past, typical power consumption for each equipment enclosure in a data facility was on the order of 1 kW. With the use of server blades and other high power density equipment in equipment racks, it is not uncommon for an equipment rack to have a power draw of 10 kW or even as high as 25 kW.

The power consumed by computer equipment is converted to heat and typically the cooling requirements of a facility are determined based on the power requirements of the facility. The cooling capacity of a cooling system for a data center preferably matches the cooling requirements for the facility; too little cooling capacity may render equipment in the data center incapable of operating at a desired temperature and too much cooling capacity may represent a waste in capital expenditure on cooling equipment and operation of such cooling equipment.

SUMMARY

In accordance with an aspect, there is provided a modular chiller system. The system comprises a switching and pumping module, one or more drycooler modules, and one or more chiller modules. The switching and pumping module, the one or more drycooler modules, and the one or more chiller modules share same water, power, and signal interfaces, providing for cooling capacity of the modular chiller system to be increased by adding drycooler modules or chiller modules without additional hydraulic and electrical infrastructure.

In some embodiments, the system further comprises fluid conduits configured and arranged to direct heated water from one or more condensers of the one or more chiller modules to the one or more drycooler modules. The one or more drycooler modules are configured to release heat from the heated water to the atmosphere.

In some embodiments, the system is configured to operate in an economizer-only mode in which the one or more drycooler modules are utilized to cool cooling water flowing through the system and the one or more chiller modules are not utilized, a mixed mode in which both the one or more drycooler modules and the one or more chiller modules are utilized to cool cooling water flowing through the system, and a full mechanical mode in which the one or more chiller modules are utilized to cool cooling water flowing through the system, the cooling water flowing through both the one or more drycooler modules and the one or more chiller modules in each of the economizer-only mode, the mixed mode, and the a full mechanical mode.

In some embodiments, the switching and pumping module includes water interfaces providing for hydraulic connection to a first set of water interfaces of the one or more drycooler modules, the water interfaces of the switching and pumping module being identical to a second set of water interfaces of the one or more drycooler modules.

In some embodiments, the switching and pumping module includes a power interface providing for electrical connection to a first power interface of the one or more drycooler modules, the power interface of the switching and pumping module being identical to a second power interface of the one or more drycooler modules.

In some embodiments, the switching and pumping module includes a signal interface providing for electrical communication with a first signal interface of the one or more drycooler modules, the signal interface of the switching and pumping module being identical to a second signal interface of the one or more drycooler modules.

In some embodiments, the switching and pumping module includes water interfaces providing for hydraulic connection to a first set of water interfaces of the one or more chiller modules, the water interfaces of the switching and pumping module being identical to a second set of water interfaces of the one or more chiller modules.

In some embodiments, the switching and pumping module includes a power interface providing for electrical connection to a first power interface of the one or more chiller modules, the power interface of the switching and pumping module being identical to a second power interface of the one or more chiller modules.

In some embodiments, the switching and pumping module includes a signal interface providing for electrical communication with a first signal interface of the one or more chiller modules, the signal interface of the switching and pumping module being identical to a second signal interface of the one or more chiller modules.

In some embodiments, the one or more chiller modules include a first set of water interfaces providing for hydraulic connection to the switching and pumping module and a second set of water interfaces providing for hydraulic connection between the one or more chiller modules and a terminator unit including a regulation valve configured to control a pressure differential between collectors of the terminator unit and maintain a set pressure differential through one of condensers and evaporators of the one or more chiller modules. The terminator unit may be hydraulically connected to the one or more chiller modules.

In some embodiments, the system includes a cooling water loop that passes through each of the one or more drycooler modules and one or more chiller modules.

In some embodiments, the switching and pumping module controls the flow of water to both the one or more drycooler modules and the one or more chiller modules.

In accordance with another aspect, there is provided a method of assembling a modular chiller system for a data center. The method comprises hydraulically connecting a cold water inlet and a warm water outlet of a cooling unit in the data center to a first set of water connections of a switching and pumping module, hydraulically connecting a second set of water connections of the switching and pumping module to a first set of water connections of a first chiller unit, and hydraulically connecting a second set of water connections of the first chiller unit to a first set of water connections of a second chiller unit, the second set of water connections of the first chiller unit being identical to the second set of water connections of the switching and pumping module.

In some embodiments, the method further comprises hydraulically connecting a third set of water connections of the switching and pumping module to a first set of water connections of a first drycooler module, and hydraulically connecting a second set of water connections of the first drycooler module to a first set of water connections of a second drycooler module, the second set of water connections of the first drycooler module being identical to the third set of water connections of the switching and pumping module.

In some embodiments, hydraulically connecting the third set of water connections of the switching and pumping module to the first set of water connections of the first drycooler module includes creating a water loop that flows same water through the switching and pumping module and each of the chiller units and drycooler modules.

In some embodiments, the method further comprises electrically connecting an electrical interface of the switching and pumping module to a first electrical interface of the first chiller unit, and electrically connecting a second electrical interface of the first chiller unit to a first electrical interface of the second chiller, the second electrical interface of the first chiller unit being identical to the electrical interface of the switching and pumping module.

In some embodiments, the method further comprises electrically connecting an electrical interface of the switching and pumping module to a first electrical interface of the first drycooler module, and electrically connecting a second electrical interface of the first drycooler module to a first electrical interface of the second drycooler module, the second electrical interface of the first drycooler module being identical to the electrical interface of the switching and pumping module.

In some embodiments, the method further comprises hydraulically connecting fluid interfaces of a terminator unit to a second set of water connections of the second chiller unit, the terminator unit including a regulation valve configured to control a pressure differential between the fluid interfaces of the terminator unit and maintain a set pressure differential through one of condensers and evaporators of the first and second chiller modules.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
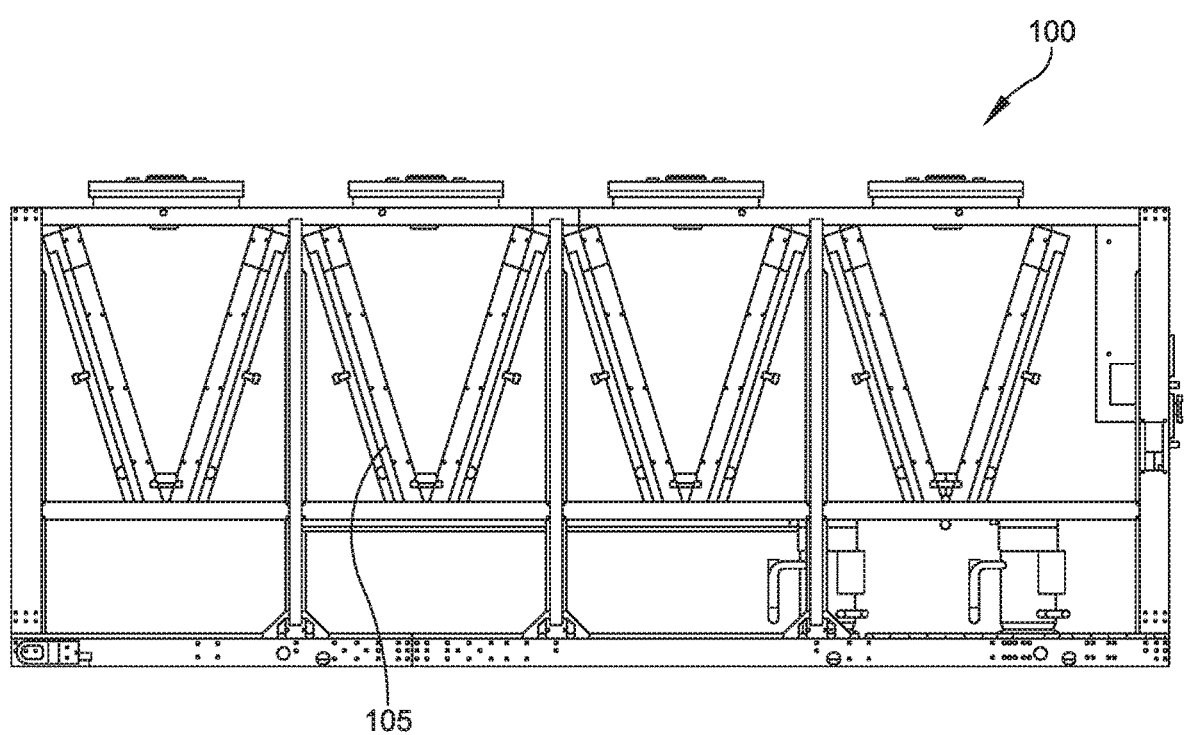
FIG. 1 illustrates a chiller with integrated economizer units.

Aspects and embodiments disclosed herein are not limited to the details of construction and the arrangement of components set forth in the following description or illustrated in the drawings. The disclosed aspects and embodiments are capable of being practiced or of being carried out in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items.

Due to the increase of the operative temperature inside data centers, it is now more economically important to cool the environment within data centers at least partially utilizing economizer heat exchangers. Economizer heat exchangers (also referred to herein as drycoolers) cool air from the data center by heat exchange with air in the environment external to the data center without requiring compressors or evaporators as in conventional mechanical cooling air conditioning systems (also referred to herein as chilled water systems or chillers). In an economizer heat exchanger, a fluid, typically water, is circulated through a cooling loop in which it absorbs heat from air inside a data center, for example, utilizing a computer room air conditioner (CRAC) unit or other form of cooling unit. The economizer heat exchanger releases the heat absorbed in the data center to cooler air external to the data center utilizing a heat exchanger and associated fan. The water may contain additives, for example, antifreeze or rust inhibitors as known in the art, but for the sake of simplicity, cooling fluid utilized in aspects and embodiments of the disclosed cooling system will be referred to herein as simply water.

In the past it was common to provide a packaged chiller including both a heat exchanger for the mechanical cooling (conventional air conditioning or chilled water) mode and a heat exchanger for the economizing mode (referred to herein also as free cooling—FC). The increased power efficiency associated with free cooling as compared to mechanical cooling has prompted some users to desire economizer heat exchangers with high surface areas, and thus high cooling capacities, for cooling data centers. For package solutions, it is not possible to increase the surface area of the economizer heat exchanger to increase the FC operation. So, trying to maximize the FC operation as much as possible, some data center cooling system designs include splitting the economizing functionality from the mechanical cooling functionality by using one or more stand-alone drycoolers combined with one or more stand-alone mechanical cooling chillers. The disadvantages of such a design include:

1. The data center operator must complete the installation with piping, water pumps, and the control logic to operate the drycoolers, chillers, and pumps together;

2. The required installation footprint is increased; and

3. The data center operator must install drycoolers and chillers sized for the maximum cooling capacity that will be required by the datacenter when operating at full capacity, when usually the cooling capacity required by the data center upon initial commissioning is very low.

Aspects and embodiments disclosed herein provide a cooling solution for a data center that maximizes the use of external ambient air up to the highest practical temperature to provide low energy cooling capacity for the data center while utilizing common water, power, and signal interfaces between drycooler (economizer) and chilled water cooling units to provide a modular and easily scalable overall cooling system.

FIG. 1 shows a traditional chiller 100 with integrated FC (economizer) coils 105. This solution does not work well with modern high energy consuming data centers. In modern high energy consuming data centers, it is often more energy efficient to use ambient external air to cool the data center than chilled water cooling units (chillers). Traditional chillers, however, typically have restricted heat exchanger surface (in the space of a shippable container) and only operate efficiently in full FC mode (with no mechanical cooling utilizing the condensers and evaporators) with ambient air having a temperature of 6-8° C.

Figure 2:
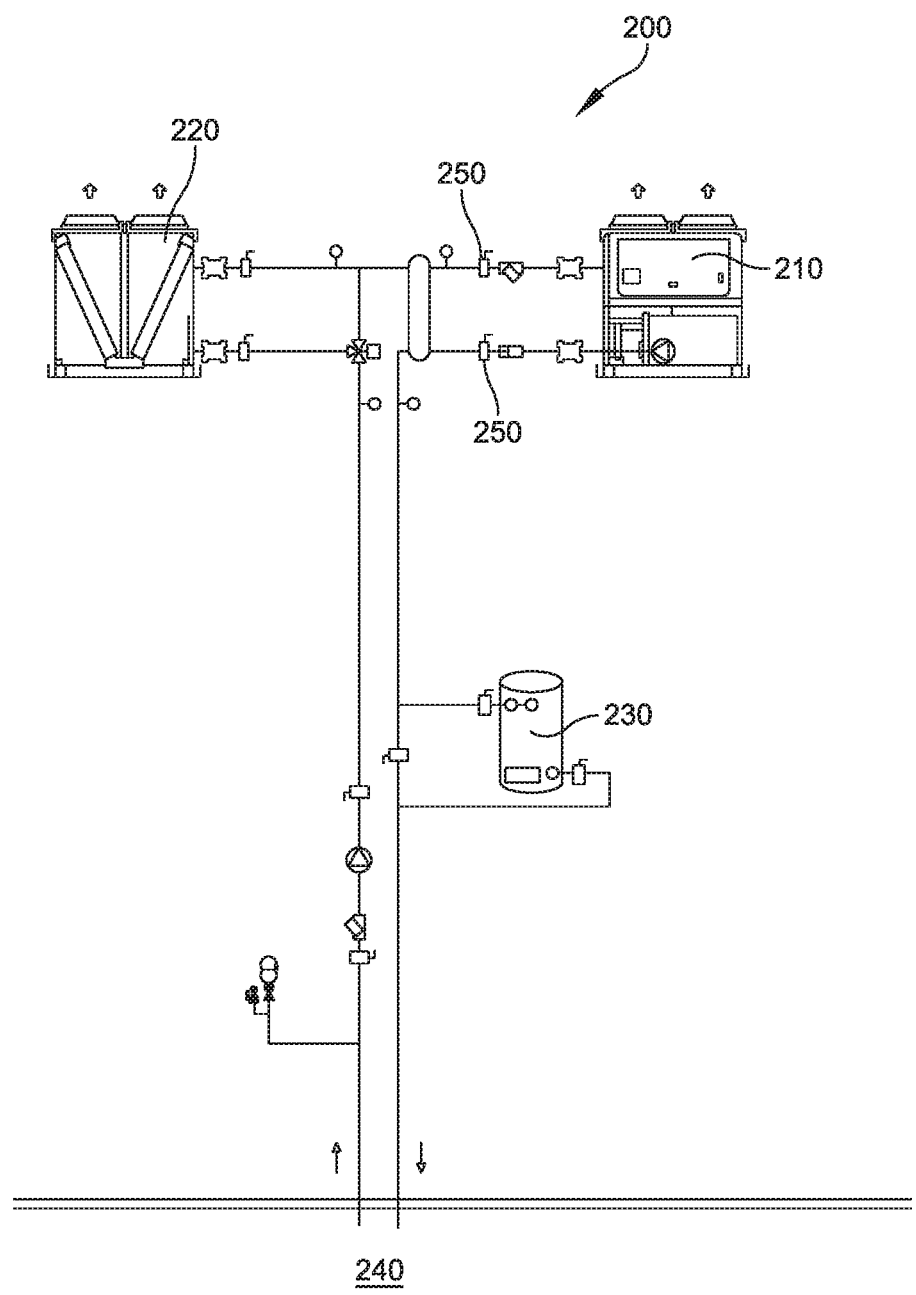
FIG. 2 illustrates a data center cooling system including a standalone chiller and separate standalone economizer.

To raise the ambient air temperature at which a data center cooling system may operate in full FC mode various approaches may be used. One possible design for raising the ambient air temperature at which a data center cooling system may efficiently operate in full FC mode is illustrated in FIG. 2. The system illustrated generally at 200 in FIG. 2 includes a very large drycooler 210 and a chiller 220 operating only in mechanical mode (no FC mode available on the chiller). The cooling system further includes a pumping station 230 to provide the right water flow and the right pressure head to one or more cooling units in the data center 240. The chiller 220 is hydraulically connected in parallel to the drycooler 210. Dedicated water valves 250 can let the water bypass the drycooler 210.

According to how the water valves or secondary pumps of the system 200 are set, the system 200 can work in full FC mode, in full mechanical mode, or both to get the mixed operation (both FC and mechanical mode at the same time).

The system 200 has the following disadvantages:

1. The required footprint of this design is very high since there are two heat rejection heat exchangers: one for the drycooler and one for the chiller;

2. The capital and operating costs are high due to the presence of two air heat exchangers and respective fans;

3. The data center designer must select a chiller and drycooler having cooling capacities that will satisfy the maximum required cooling demand of the data center from the beginning of the data center operation. The thermal load of a data center upon initial commissioning is typically is very low with respect to the maximum thermal load of the data center when operating at full capacity, and normally the data center owner would like to distribute the capital cost of the data center over time;

4. It is not an integral solution and the data center operator must provide the water pumps and put the system together, which may incur a high installation cost; and 5. Redundancy management is expensive: to have redundancy, an entire system must be added one time (n+1) or two times (n+2). This means an increase in the initial cooling system cost.

Figure 3:
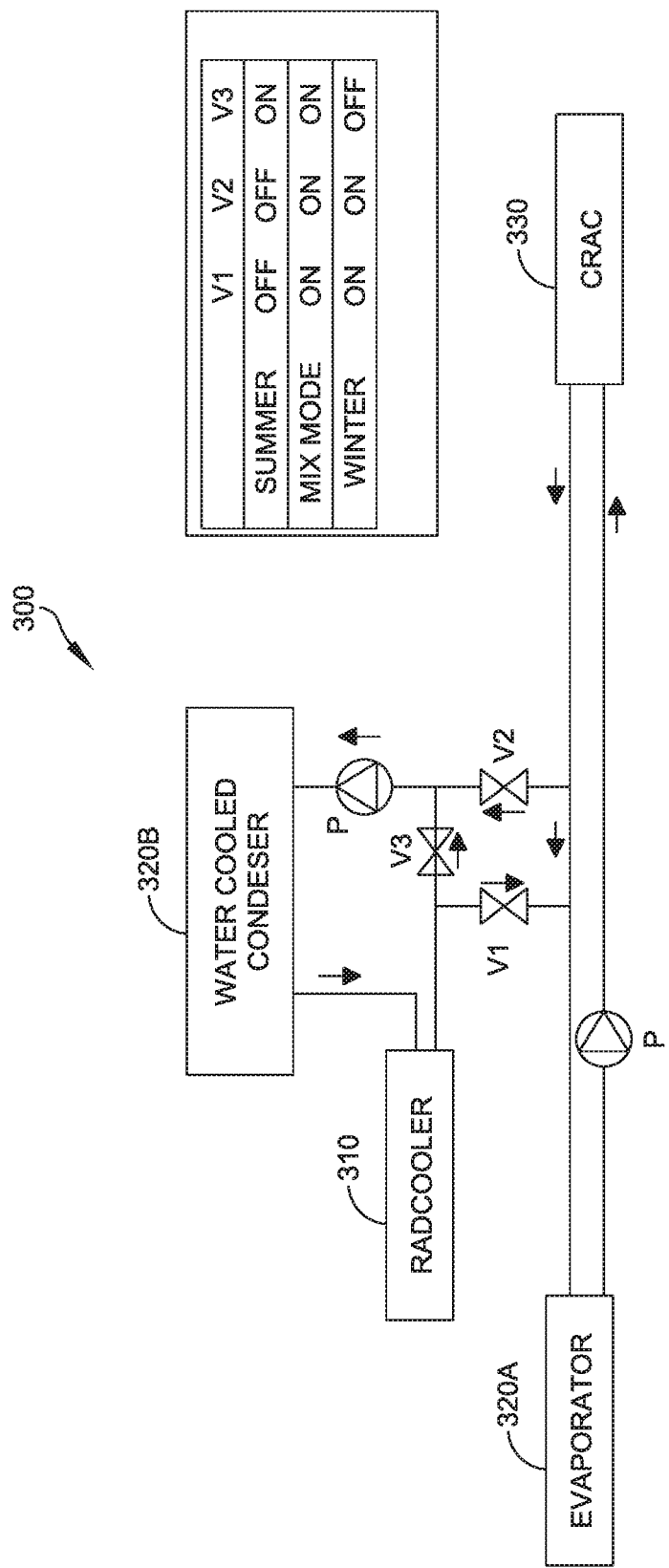
FIG. 3 illustrates a data center cooling system including a chiller and an economizer in which the economizer may be used to reject condensing heat.

To solve a portion of the disadvantages of the system 200, an alternatively designed system, illustrated generally at 300 in FIG. 3 may be utilized. This system again uses a large drycooler 310 and a mechanical mode chiller including an evaporator 320A and condenser 320B and a system of pumps P and valves V1, V2, V3 to use the drycooler 310 both for FC operation and to reject the condensing heat when operating the system 300 in mechanical mode. Cooled water is supplied by the drycooler 310 and/or chiller 320A, 320B to a CRAC 330 or other cooling unit disposed in a data center. System 300 allows for mixed mode operation as well.

With respect to the system 200 of FIG. 2, system 300 partially solves the footprint issue and partially solves the cost issue since the drycooler 310 dissipates heat in mechanical mode operation of the cooling system.

System 300, however, still may exhibit the following disadvantages:

1. The data center designer must select a chiller and drycooler having cooling capacities that will satisfy the maximum required cooling demand of the data center from the beginning of the data center operation. The thermal load of a data center upon initial commissioning is typically is very low with respect to the maximum thermal load of the data center when operating at full capacity, and normally the data center owner would like to distribute the capital cost of the data center over time;

2. It is not an integral solution and the data center operator must assemble the drycooler, chiller, and pumping system. Furthermore, the data center operator must provide the control logic for operating the drycooler, chiller, and pumps; and 3. Redundancy management is expensive: in order to have redundancy, an entire system must be added one time (n+1) or two times (n+2).

Aspects and embodiments of the improved data center cooling system disclosed herein include some features similar to those of system 300 of FIG. 3, but with one or more of the following additional features:

1. Some embodiments of the improved data center cooling system are a modular system including one single switching/pumping module, one or more drycooler modules, and one or more condensed water chiller modules;

2. The switching/pumping module and the drycooler modules may share the same water, power, and signal interfaces;

3. The switching/pumping module and the chiller modules may share the same water, power, and signal interfaces;

4. The switching/pumping module includes pumps and valves to direct water to the drycooler modules and to the water condenser;

5. Due to their modularity, drycoolers can added after the initial system installation and may be easily connected to each other and to the switching/pumping module to increase the cooling capacity of the system. Similarly, chillers can be added and easily connected to each other and to the switching/pumping module in to increase the cooling capacity of the system; and 6. Redundancy management costs less: it is sufficient to include only one or two redundant chillers or drycoolers.

Due to its modular architecture, aspects and embodiments of the improved data center cooling system provide at least the following advantages:

a. The complete system, comprising economizers, chillers, and pumps, is easy to install because all the interfaces are already preset;

b. Easy cooling scalability: drycooler modules and/or chillers can be added over time; as a consequence, the initial system cost is lower and additional costs are accrued when it becomes desired to increase the cooling capacity as the data center grows;

c. The modules may be easily upgraded after initial installation (for example, for new refrigerant, new component with more efficiency, etc.);

d. System redundancy is easy to achieve; and e. The ratio between the cooling capacity provided by the drycoolers and the cooling capacity provided by the chillers can be varied according to the latitude of the installation and the associated climate profile.

Figure 4:
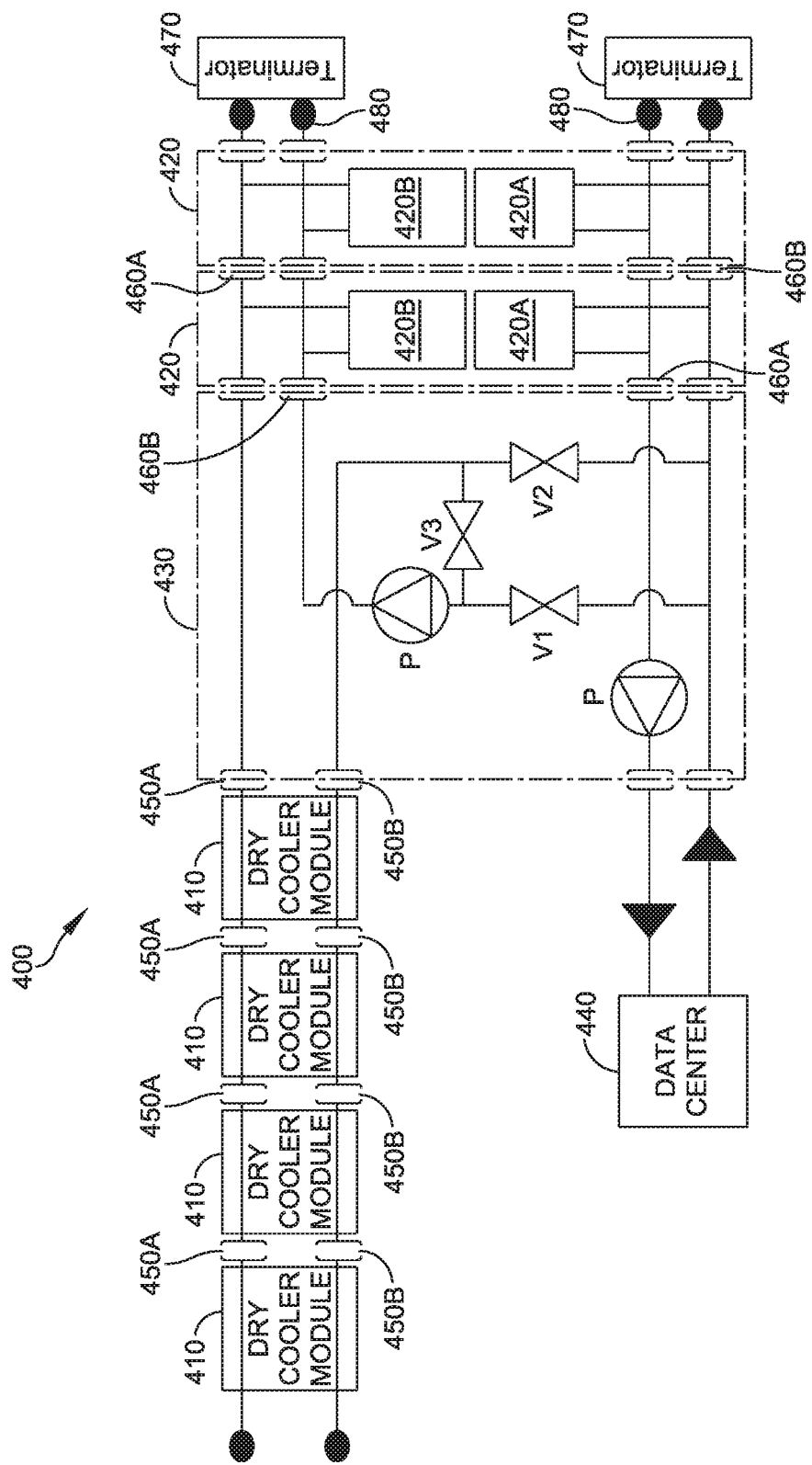
FIG. 4 illustrates an embodiment of a modular data center cooling system.

An embodiment of an improved data center cooling system is illustrated generally at 400 in FIG. 4. A switching and pumping module 430 is the central element of system 400. The switching and pumping module 430 is connected hydraulically with one or more cooling units, for example, a CRAC unit 330 as illustrated in FIG. 3 within a data center 440, with one or more drycoolers 410, and with one or more condensed water chillers 420. The chillers 420 include respective evaporators 420A and condensers 420B. Each drycooler 410 includes water manifolds 450A, 450B so that each drycooler 410 can be hydraulically connected to another drycooler 410 to form a combined pair of manifolds 450A or 450B. Manifolds 450A, 450B enable each drycooler 410, once installed, to be hydraulically connected in series with each other drycooler 410 when arranged as illustrated in FIG. 4. The manifolds 450A, 450B include water interfaces on the drycoolers 410 that are identical to water interfaces on the switching and pumping module 430 that provide for hydraulic connection between the switching and pumping module 430 and water interfaces of the drycooler modules. It is to be understood that manifolds 450A, 450B collectively represent the water manifolds between the drycoolers 510 as well as the power and signal interfaces between the drycoolers 510. In addition to the water interfaces on the drycoolers 410 being identical to water interfaces on the switching and pumping module 430 that provide for hydraulic connection between the switching and pumping module 430 and water interfaces of the drycooler modules 410, the power and signal interfaces between the drycoolers 410 are identical to power and signal interfaces on the switching and pumping module 430 that provide for power and signal communication between the switching and pumping module 430 and the drycoolers 410.

The same arrangement is used also for the water chillers 420, with the only difference being that two pairs of manifolds 460A, 460B are created for each chiller 420, one for the cold water side and another for the warm water side. It is to be understood that manifolds 460A, 460B collectively represent the water manifolds between the water chillers 420 as well as the power and signal interfaces between the water chillers 420. In addition to the water interfaces on the water chillers 420 being identical to water interfaces on the switching and pumping module 430 that provide for hydraulic connection between the switching and pumping module 430 and water interfaces of the water chillers 420, the power and signal interfaces between the water chillers 420 are identical to power and signal interfaces on the switching and pumping module 430 that provide for power and signal communication between the switching and pumping module 430 and the water chillers 420. Regulation elements, referred to herein as terminators 470, are disposed at the end of the manifold of the evaporators 420A and at the end of the manifold of the condensers 420B. The terminators 470 function to keep the water flow passing through each chiller 420 constant, even as chillers 420 are added or removed from the system. Each terminator 470 contains a regulation valve that controls the pressure differential between the liquid interfaces 480 of the terminators 470 to maintain set pressure differentials through the condensers 420B and evaporators 420A.

Figure 5:
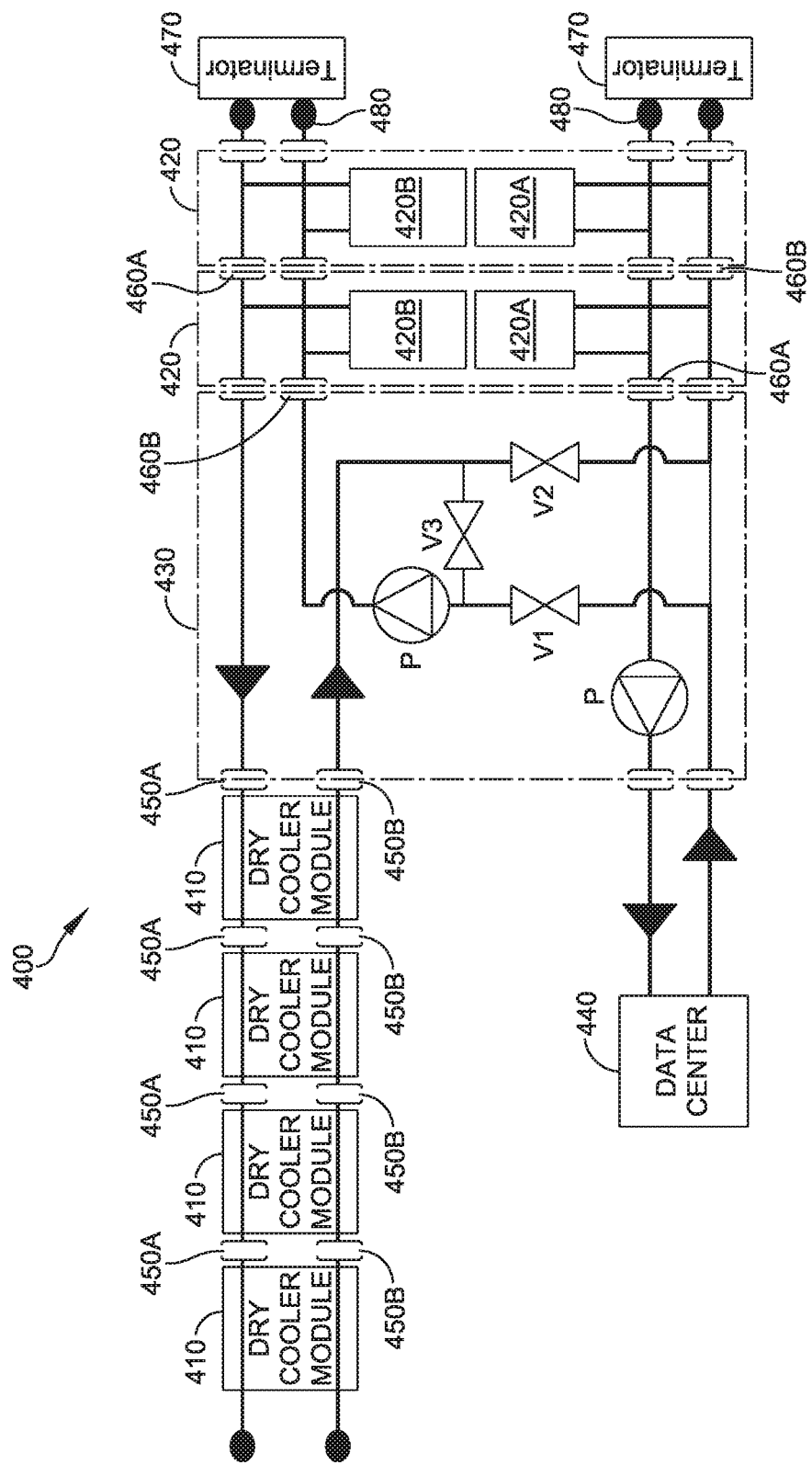
FIG. 5 illustrates the system of FIG. 4 in a first mode of operation.

In operation, when the external ambient temperature is cold enough, the cooling of the data center 440 can be realized utilizing only the drycoolers 410. FIG. 5 shows the operation in economizing-only mode which is used when the external ambient temperature is cold enough to cool down the water in the cooling loop of the cooling system to the water set point utilizing only the drycoolers 410. In economizing-only mode operation valves V1 and V2 are opened and operation valve V3 is closed. In FIG. 5 and the following FIGS. 6 and 7, the heavy lines indicate conduits though which water is flowing in the illustrated mode of operation.

Figure 6:
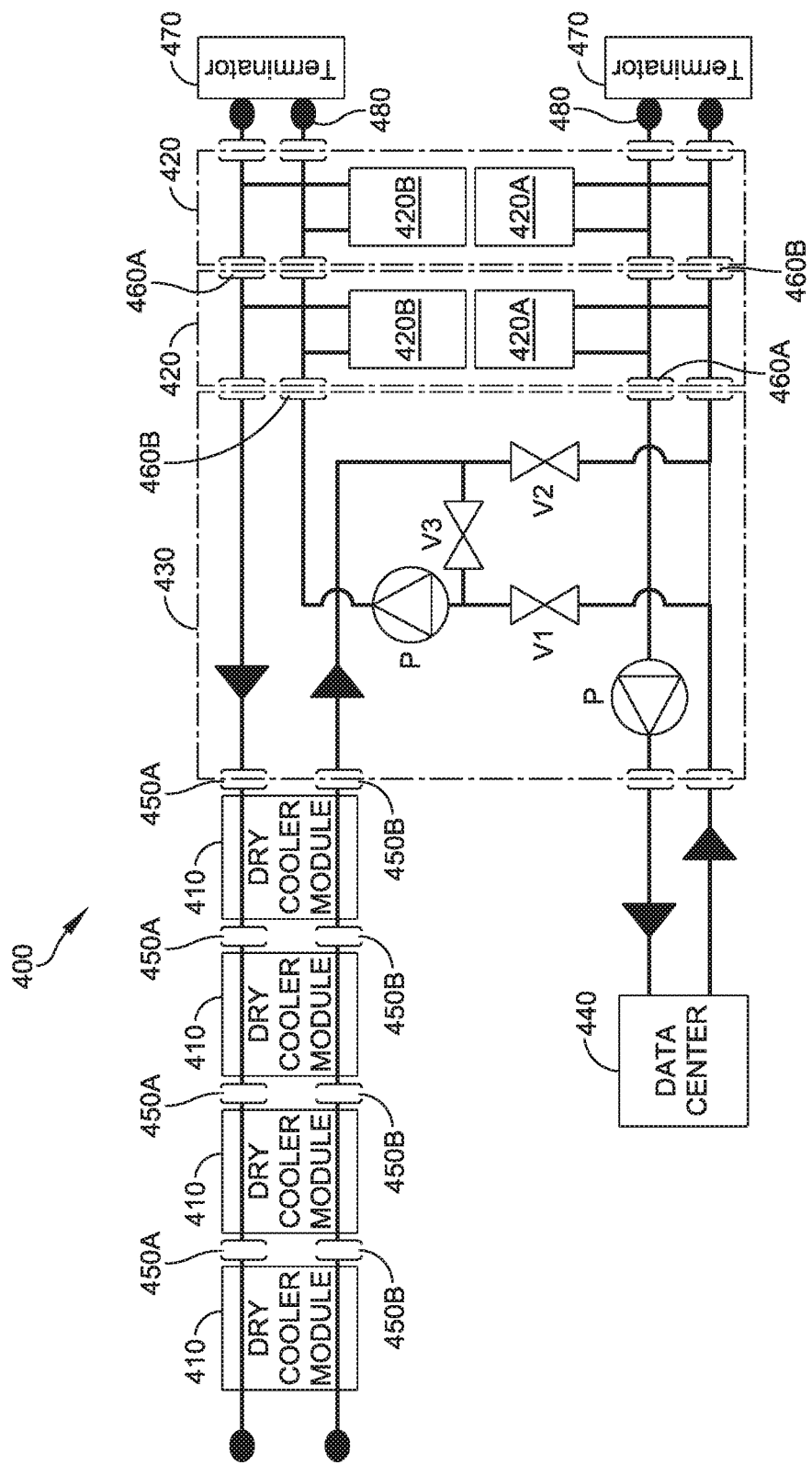
FIG. 6 illustrates the system of FIG. 4 in a second mode of operation.

FIG. 6 shows the operation of the system 400 in mixed mode, i.e., when the external air is not so cool for the drycoolers 410 to cool down the water in the cooling loop of the cooling system to the set point but it is cold enough to cool down the water from the inlet water temperature (the temperature of water exiting cooling units in the data center) to an intermediate water temperature between the inlet temperature and the set temperature. In the mixed mode of operation, each of valves V1, V2, and V3 are opened. The evaporators 420A of the chillers 420 cool down the water in the cooling loop of the cooling system from the intermediate temperature to the set point.

Figure 7:
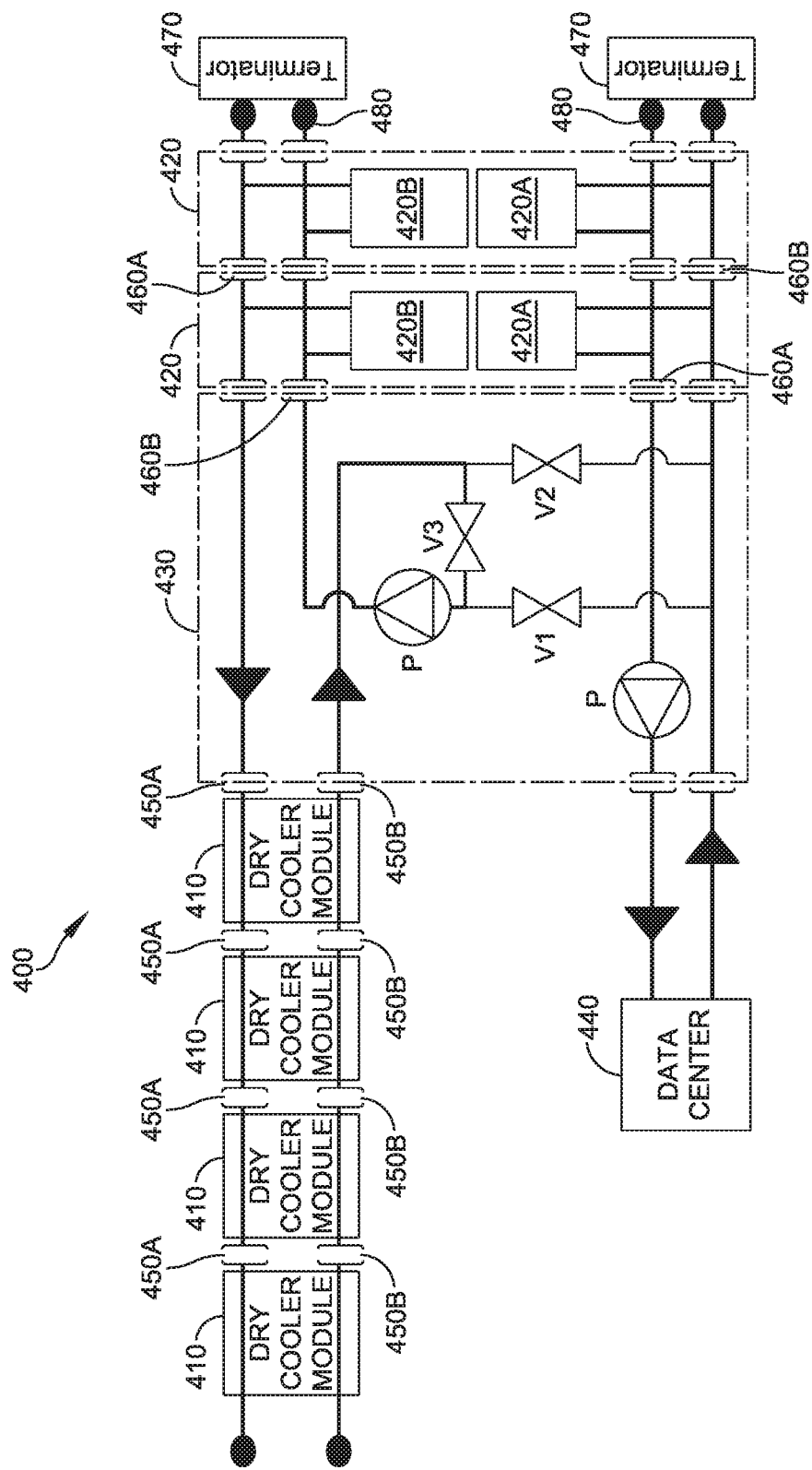
FIG. 7 illustrates the system of FIG. 4 in a third mode of operation.

FIG. 7 shows the operation in full mechanical mode, which may be used when the ambient air is warmer than the temperature of cooling water output from the cooling units of the data center 440. Only the chillers 420 provide the cooling, and the drycoolers 410 are used to reject the condensing heat to the ambient air. In full mechanical mode, the evaporators 420A of the chillers 420 provide the entire cooling of the water in the cooling loop of the cooling system, and the drycoolers 410 are used to reject the heat generated in the condensers 420B of the chillers 420 to the ambient.

In the economizer mode the water flow passing through the cold water manifolds 450A and the warm water manifolds 450B (FIG. 5) is the same and equal to nominal water flow. In the mechanical mode, instead, the flow rate of water through the warm water manifolds (450A, 460A in FIG. 6) between the chiller condensers 420B and drycoolers 410 is higher to limit the condensing temperature under the limit allowed by the compressor. As a consequence, in the mix mode, the water flow through drycoolers 410 and condensers 420B is increased progressively from the nominal water flow of the economizer mode as the portion of the cooling provided by the chillers 420 is progressively increased as the external ambient temperature increases relative to the inlet water temperature.

Regulation of speed of the pumps P may be performed utilizing an algorithm where a PID (proportional-integral-derivative) control loop changes the pump speed to achieve a pre-set condensing temperature, this latter being, in turn, a linear function of the intermediate temperature.

Figure 12:
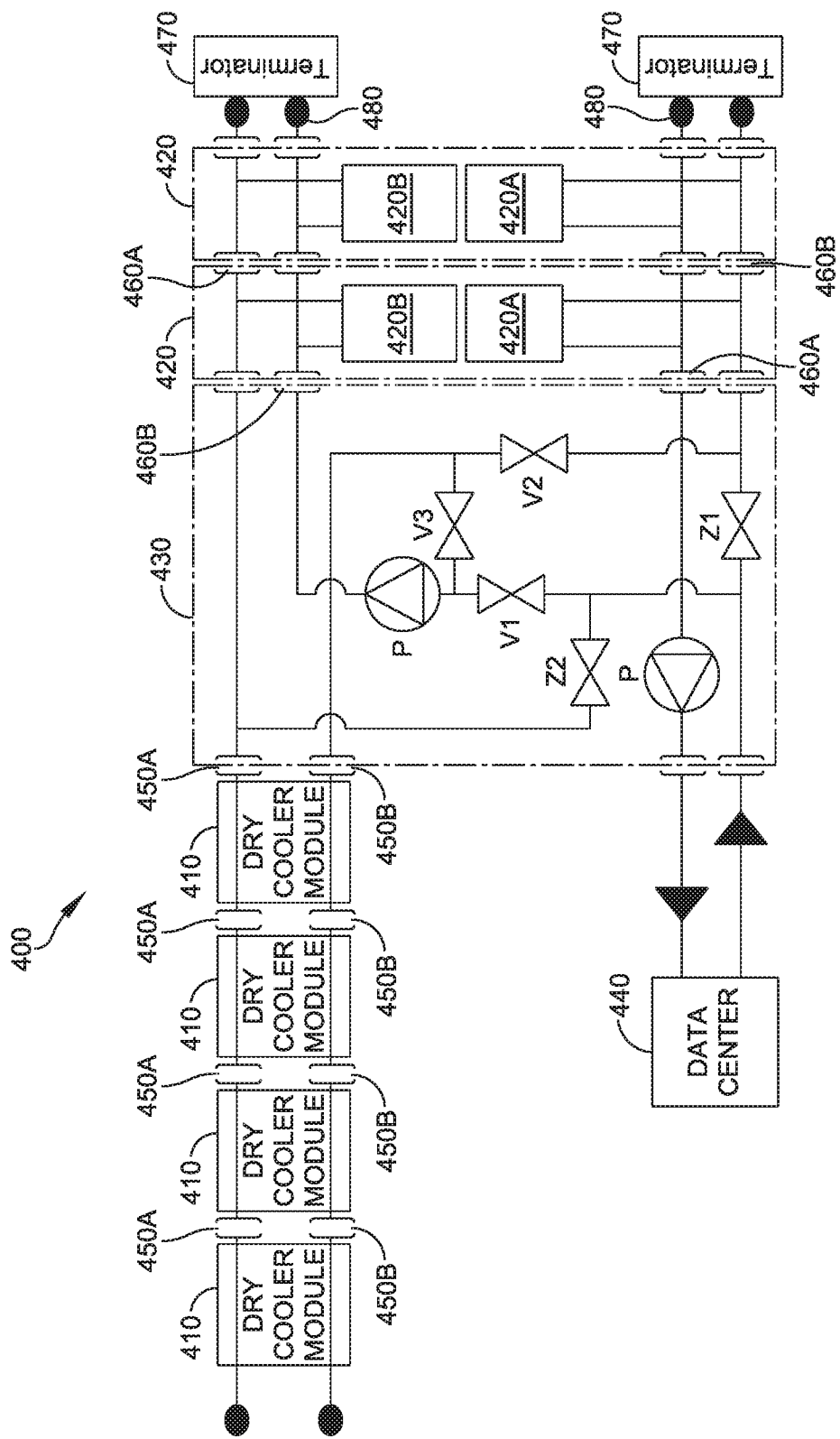
FIG. 12 illustrates another embodiment of a modular data center cooling system.

FIG. 12 shows a second embodiment where the hydro switch module includes a valve Z1 on the inlet manifold and a by-pass line Z2.

Figure 13:
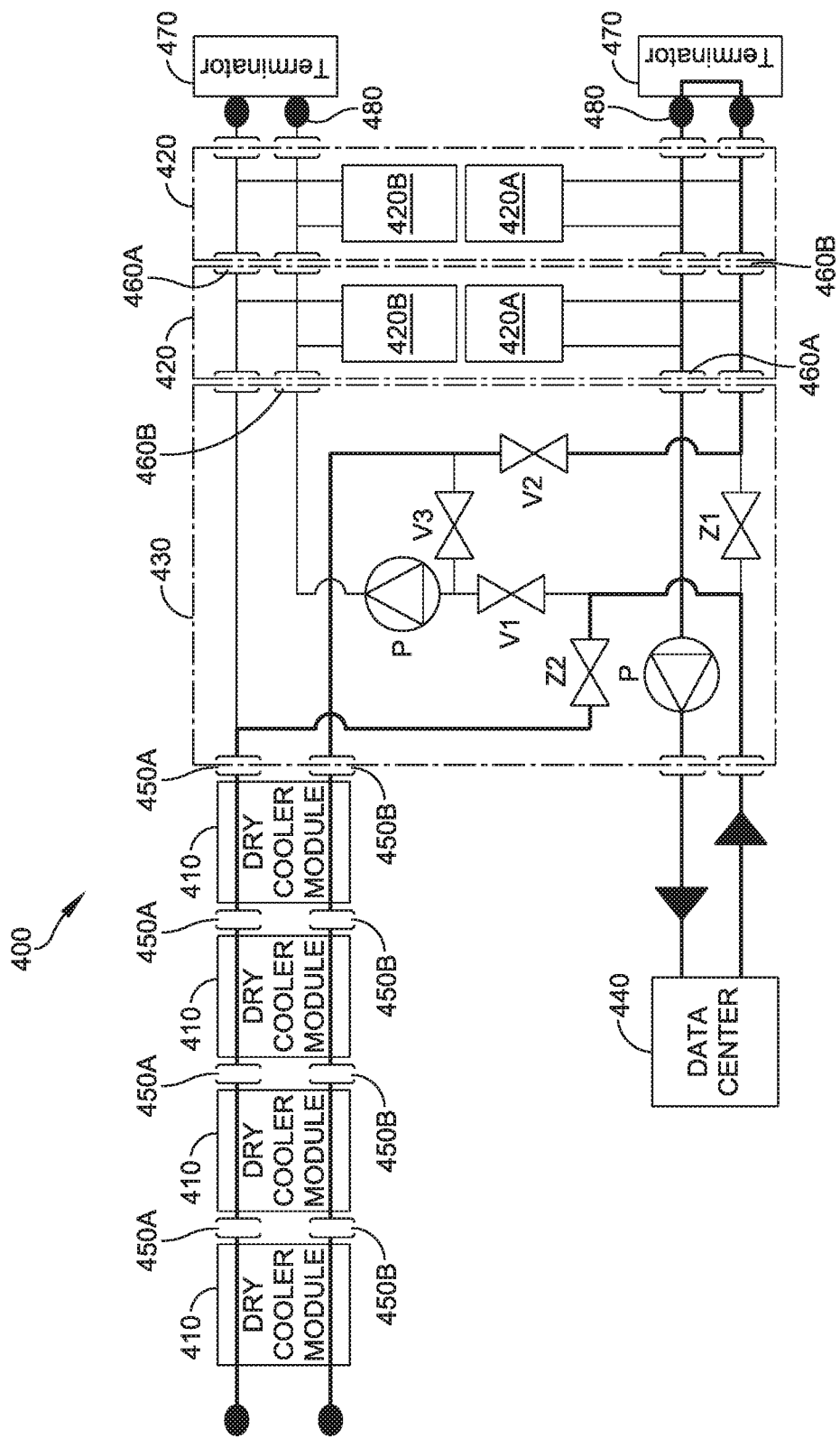
FIG. 13 illustrates the system of FIG. 12 in a first mode of operation.

In FC operation (FIG. 13) the by-pass valve Z1 is opened to prevent the water from passing through the condensers. This allows less pressure drop on the water line with an improved energy saving.

Figure 14:
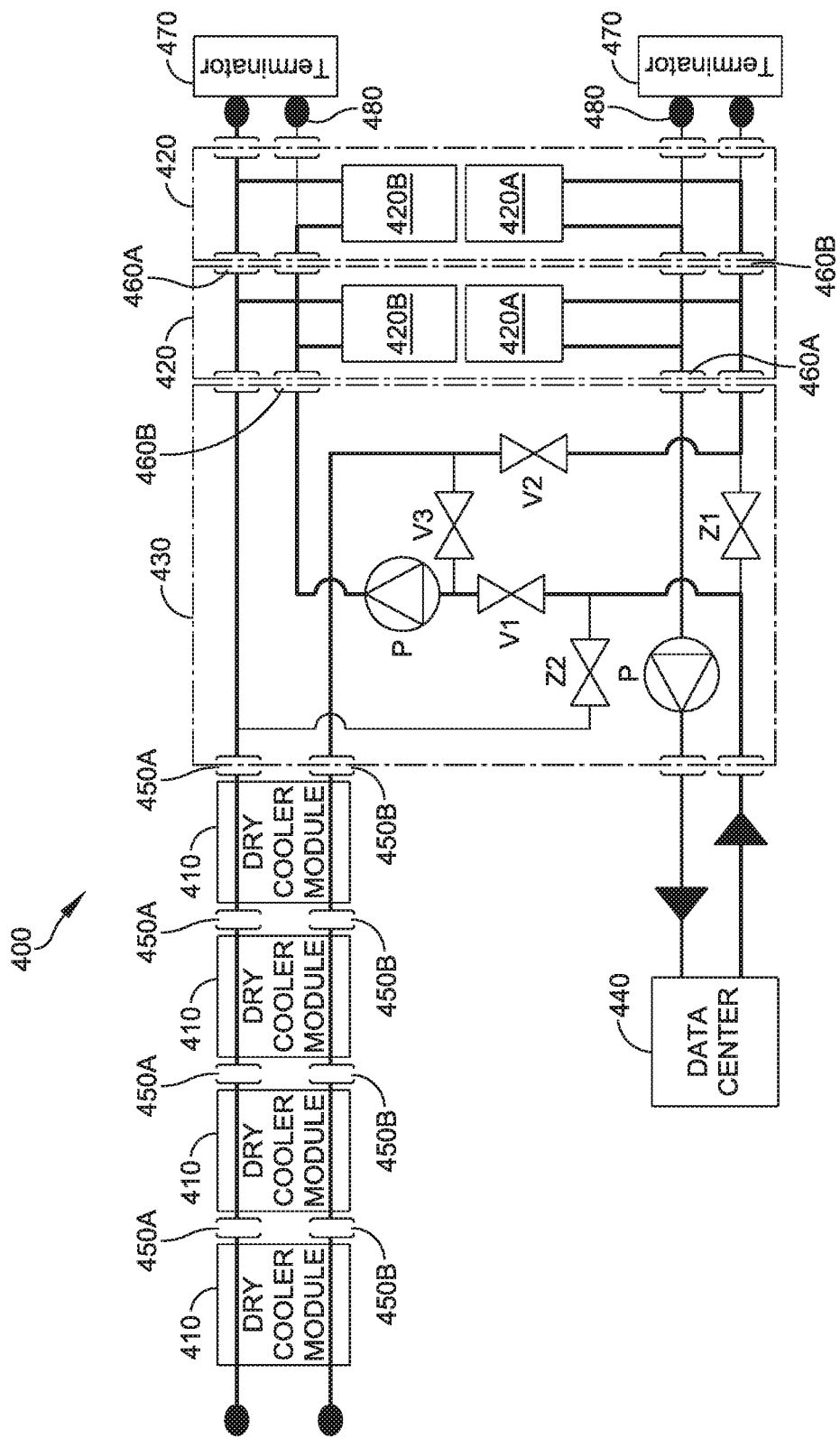
FIG. 14 illustrates the system of FIG. 12 in a second mode of operation.
Figure 15:
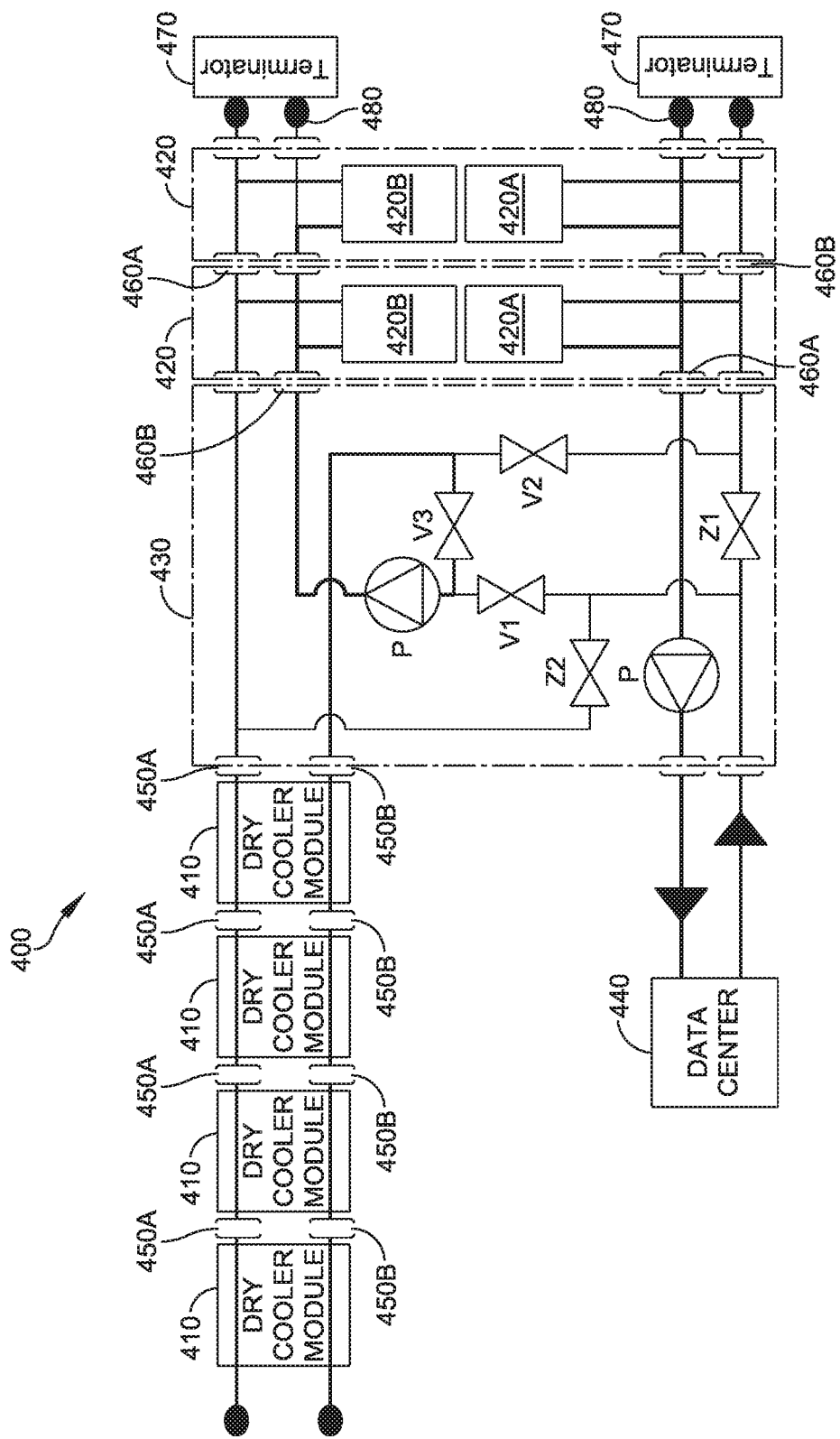
FIG. 15 illustrates the system of FIG. 12 in a third mode of operation.

In the mix mode (FIG. 14) and in the mechanical cooling mode (FIG. 15) the by-pass line valve Z1 is closed and the system works as previously described.

Figure 8:
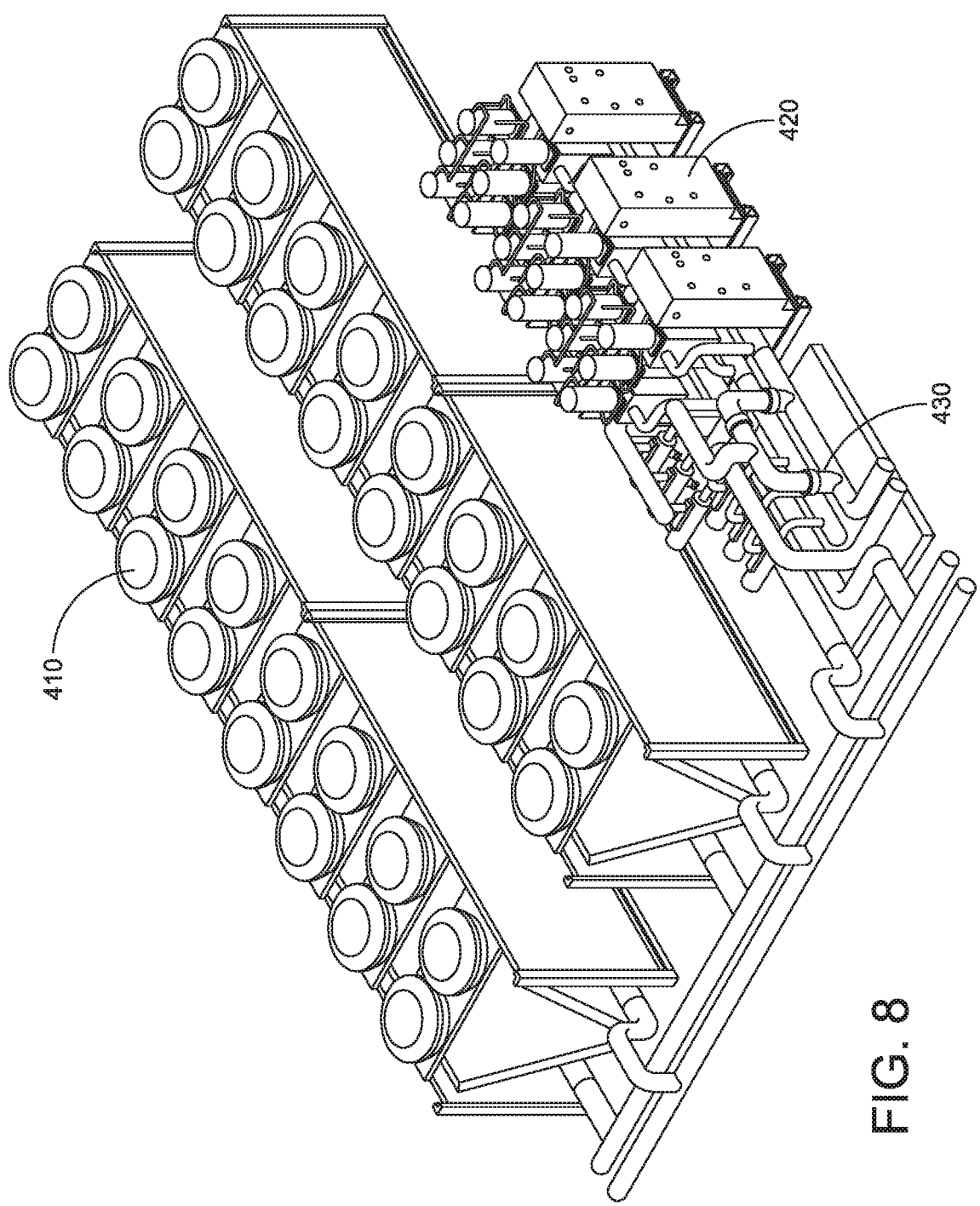
FIG. 8 illustrates an embodiment of a data center cooling system in a first configuration.
Figure 9:
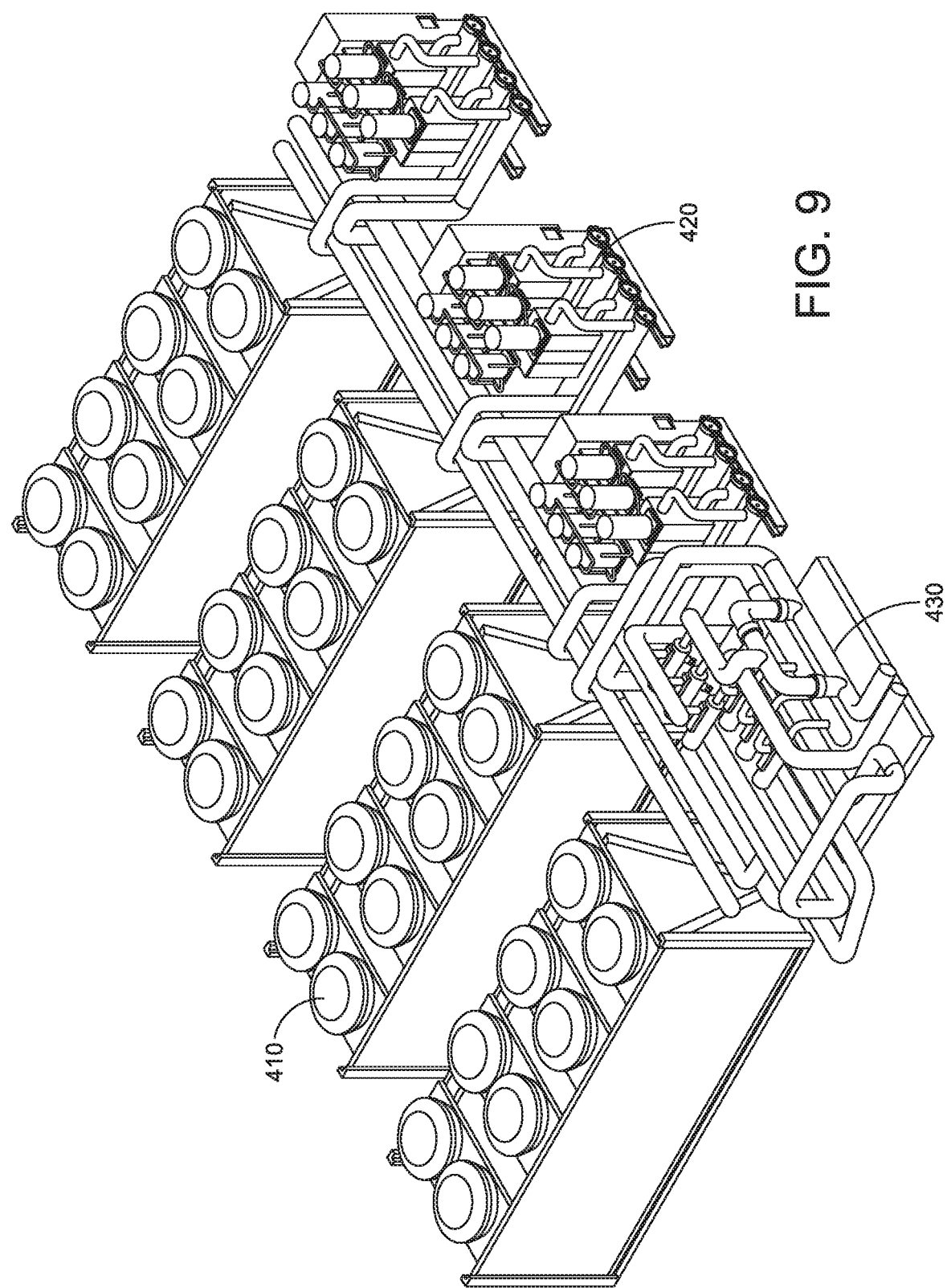
FIG. 9 illustrates an embodiment of a data center cooling system in a second configuration.
Figure 10:
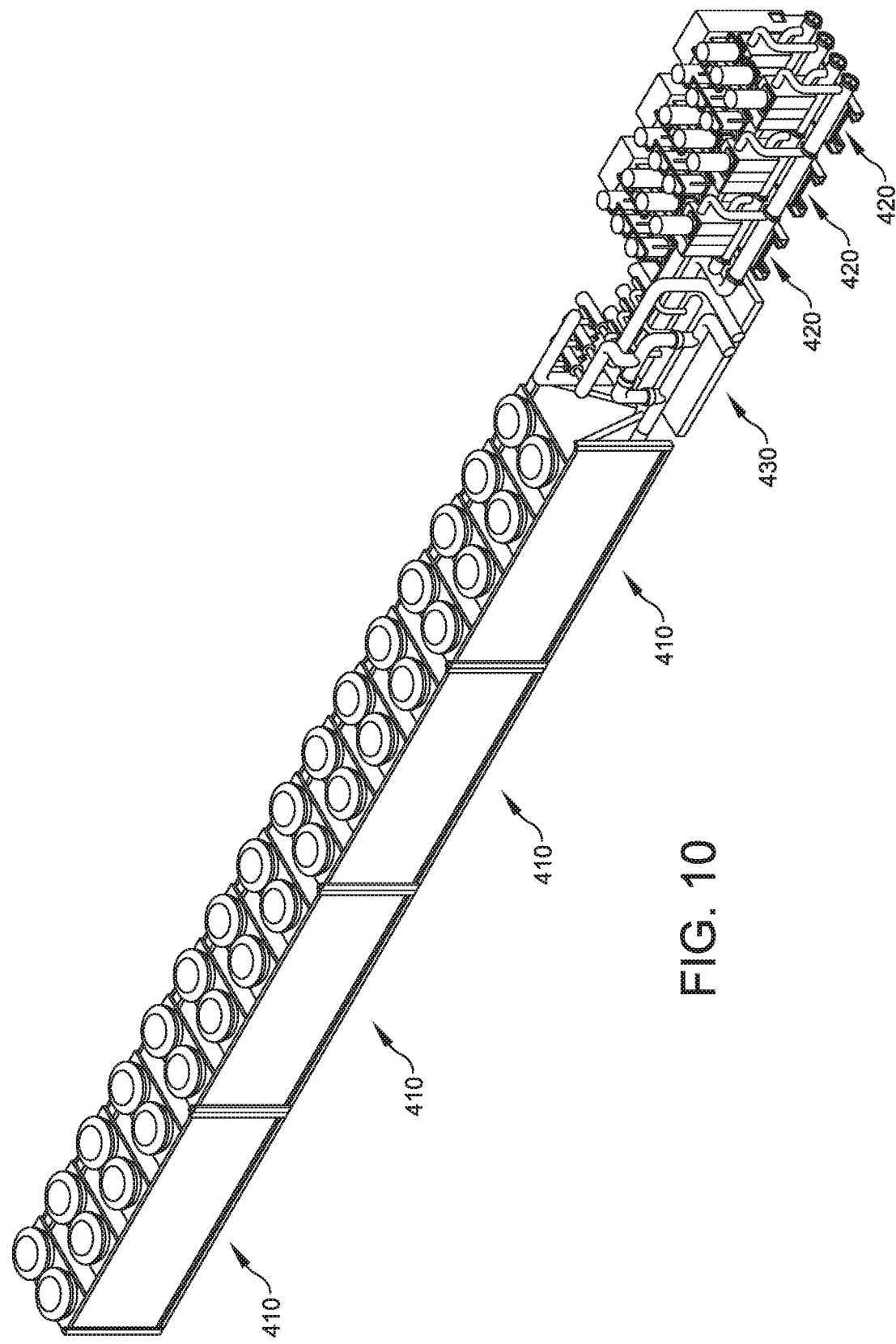
FIG. 10 illustrates an embodiment of a data center cooling system in a third configuration.

Aspects and embodiments of the data center cooling system disclosed herein allows different disposition of the several modules to adapt better to available space without losing the advantage of having standardized interfaces, and consequently to add modules without adding other infrastructures. For example, FIG. 8 illustrates one embodiment of a data center cooling system 800 including two banks of two serially connected drycooler modules 410 arranged in parallel and three chiller modules 420 arranged in series. FIG. 9 illustrates another embodiment of a data center cooling system 900 including four drycooler modules 410 arranged in parallel and three chiller modules 420 arranged in parallel. FIG. 10 illustrates another embodiment of a data center cooling system 900 including four drycooler modules 410 arranged in series and three chiller modules 420 arranged in series.

Figure 11:
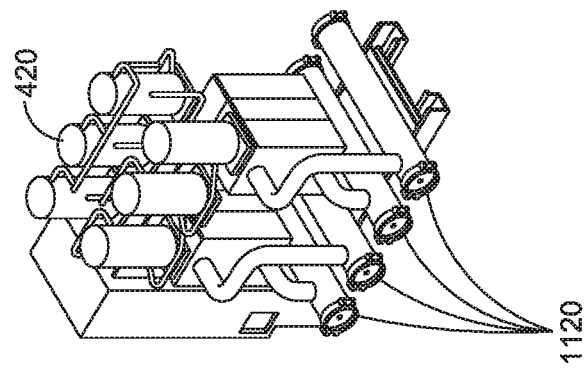
FIG. 11 illustrates embodiments of major components of a data center cooling system.
Figure 11:
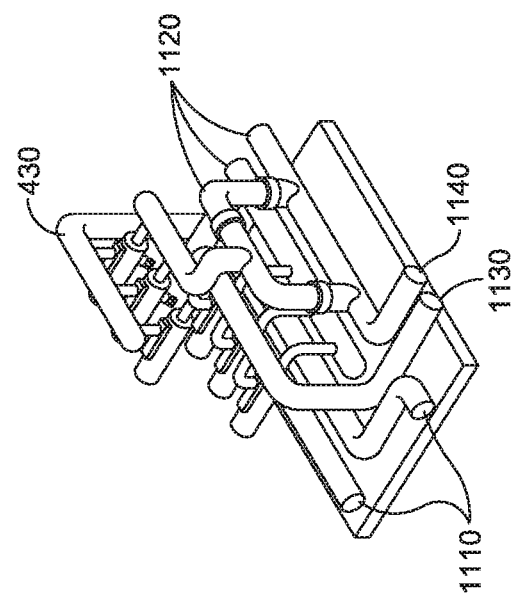
Figure 11:
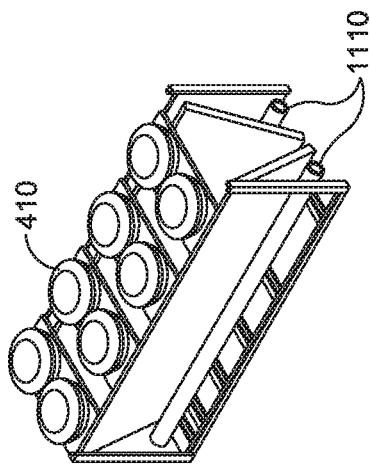

FIG. 11 illustrates the main blocks of aspects and embodiments of the disclosed data center cooling system including a drycooler module 410, a chiller module 420, and a switching and pumping module 430. Standardized water, power, and signal connections between the switching and pumping module 430 and drycoolers 410 and between the switching and pumping module 430 and chillers 420 are indicated at 1110 and 1120, respectively. Warm water and cool water connections for connection to a cooling unit in a data center are indicated at 1130 and 1140 on the switching and pumping module 430.

For smaller cooling capacity system, it is more economically convenient to integrate the switching/pumping module and the chillers can be built in one single structure. In this case there are standardized water, power and signal interfaces between this switching/pumping module/chiller and drycoolers.

As noted above, the cooling system may be initially configured with only the number of drycooler modules 410 and chiller modules 420 sufficient to provide adequate cooling for the thermal load of a data center upon initial commissioning. As additional equipment, for example, additional servers or other computer equipment are added to the data center, additional drycooler modules 410 and/or chiller modules 420 may be added to the cooling system to provide increased cooling capacity to meet the increased thermal load of the data center.

A local control and monitoring system 510 may be provided to monitor the thermal load of the data center 440 and cooling capacity of the cooling system 400 and may provide an operator with an indication of when additional cooling capacity should be installed and whether one or more additional drycooler modules 410 and/or one or more additional chiller modules 420 should be added. The control and monitoring system 510 may be provided with a schedule of planned installation of equipment in the data center 440 and may provide the operator with a prediction of when additional cooling modules should be installed and/or a schedule for purchasing and installing same. In some embodiments, the control and monitoring system 510 may be programmed to automatically generate purchase orders for additional cooling modules when it determines that they should be provided based on a predicted thermal load of the data center 440.

Figure 16:
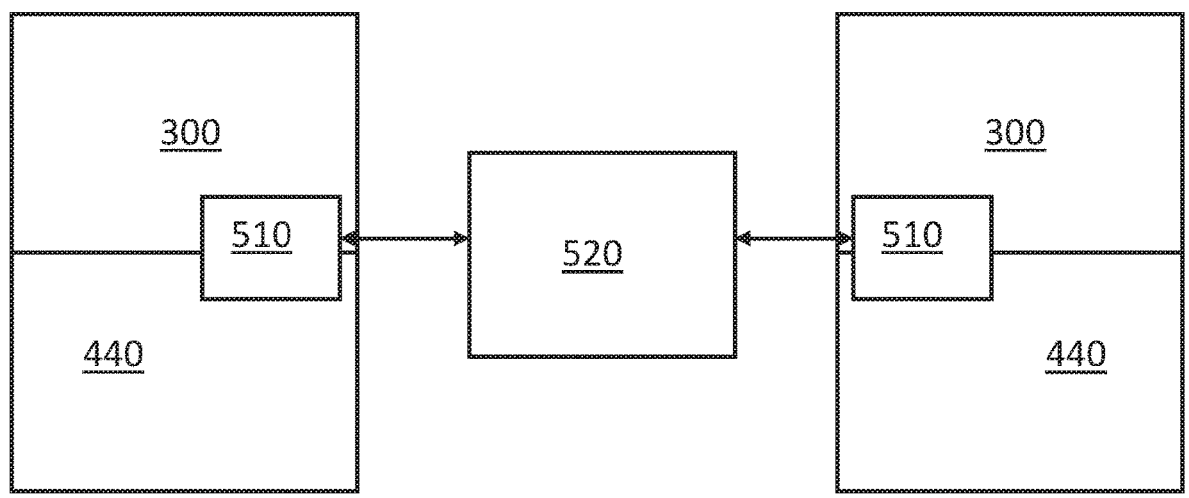
FIG. 16 illustrates communication between local control and monitoring systems of data center cooling systems with a centralized management system.

In further embodiments, the local control and monitoring system 510 may communicate with a centralized management system 520. (FIG. 16.) The centralized management system 520 may collect data from multiple data center installations and coordinate the purchasing of cooling modules and/or direct the installation of newly desired computer equipment to data centers that have excess cooling capacity to reduce the need for purchasing additional cooling capacity at one data center when another data center could accommodate the additional thermal load associated with the new computer equipment without the need for additional cooling capacity. The centralized management system 520 may also include a computer system to predict when and what type of additional cooling modules should be purchased and installed at the different data center installations being monitored, for example, based on a schedule of computer equipment installations, and may automatically generate purchase orders for additional cooling modules when it determines that they should be provided.

In some embodiments, during cooler weather, the cooling capacity of the installed drycooler modules 410 and chiller modules 420 may be higher than during warmer weather, and only a subset of the installed drycooler modules 410 and chiller modules 420 may be sufficient to cool the data center. A controller, which may be included as part of the control and monitoring system 510, may be included in the switching and pumping module 430 or in a master drycooler module 410 or master chiller module 420 that may control local controllers installed in individual drycooler modules 410 and chiller modules 420 to switch each individual drycooler module 410 or chiller module 420 on or off based on the cooling load of the data center and the ambient temperature. The control and monitoring system 510 may include dry bulb and wet bulb ambient air temperature sensors and water temperature sensors located at various locations within the cooling system 300 and/or data center 440 to provide temperature input data used to determine how many and which drycooler modules 410 and chiller modules 420 should be in operation at a given time.

Figure 17A:
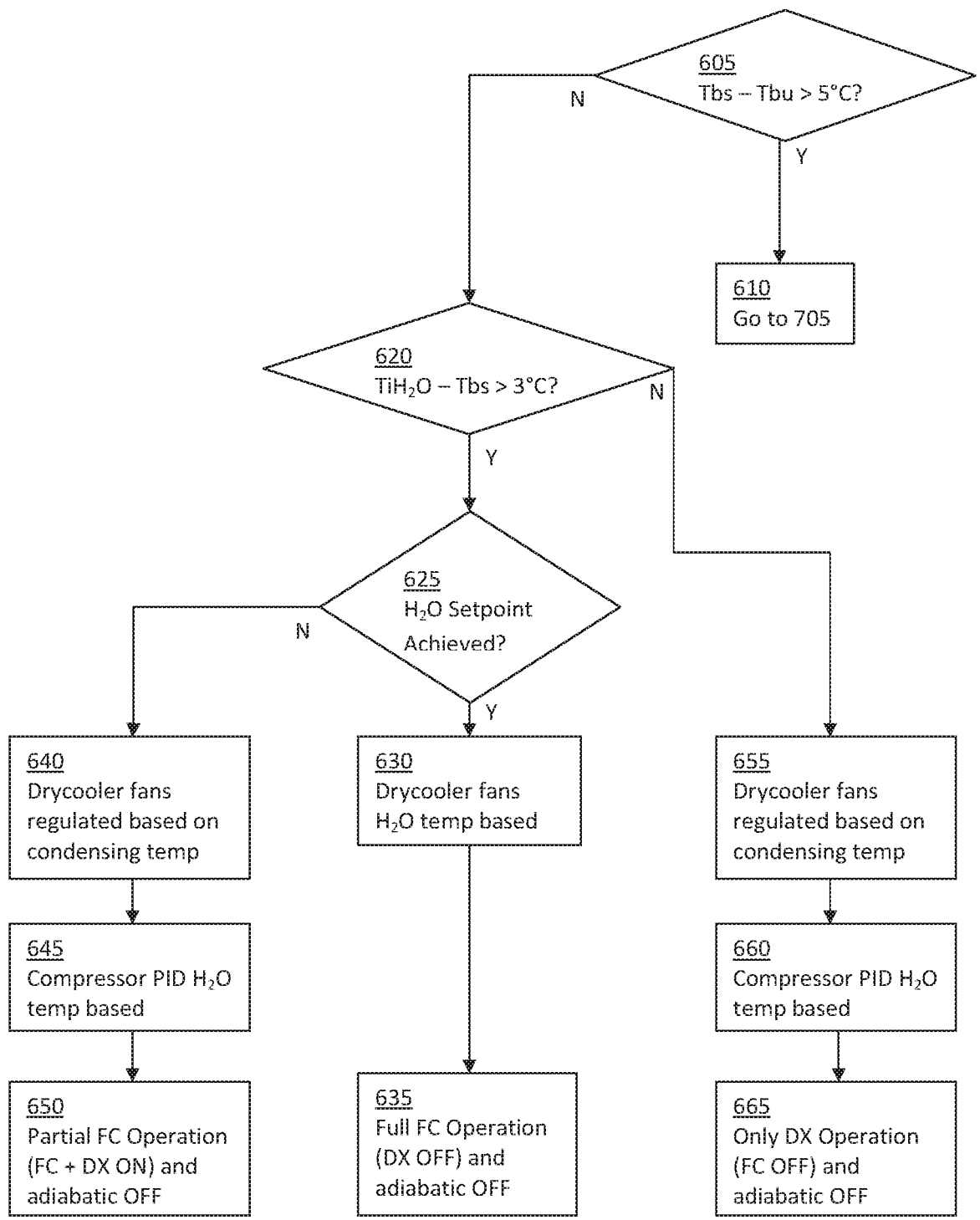
FIG. 17A illustrates a partial flowchart of a method of operating a data center cooling system.
Figure 17B:
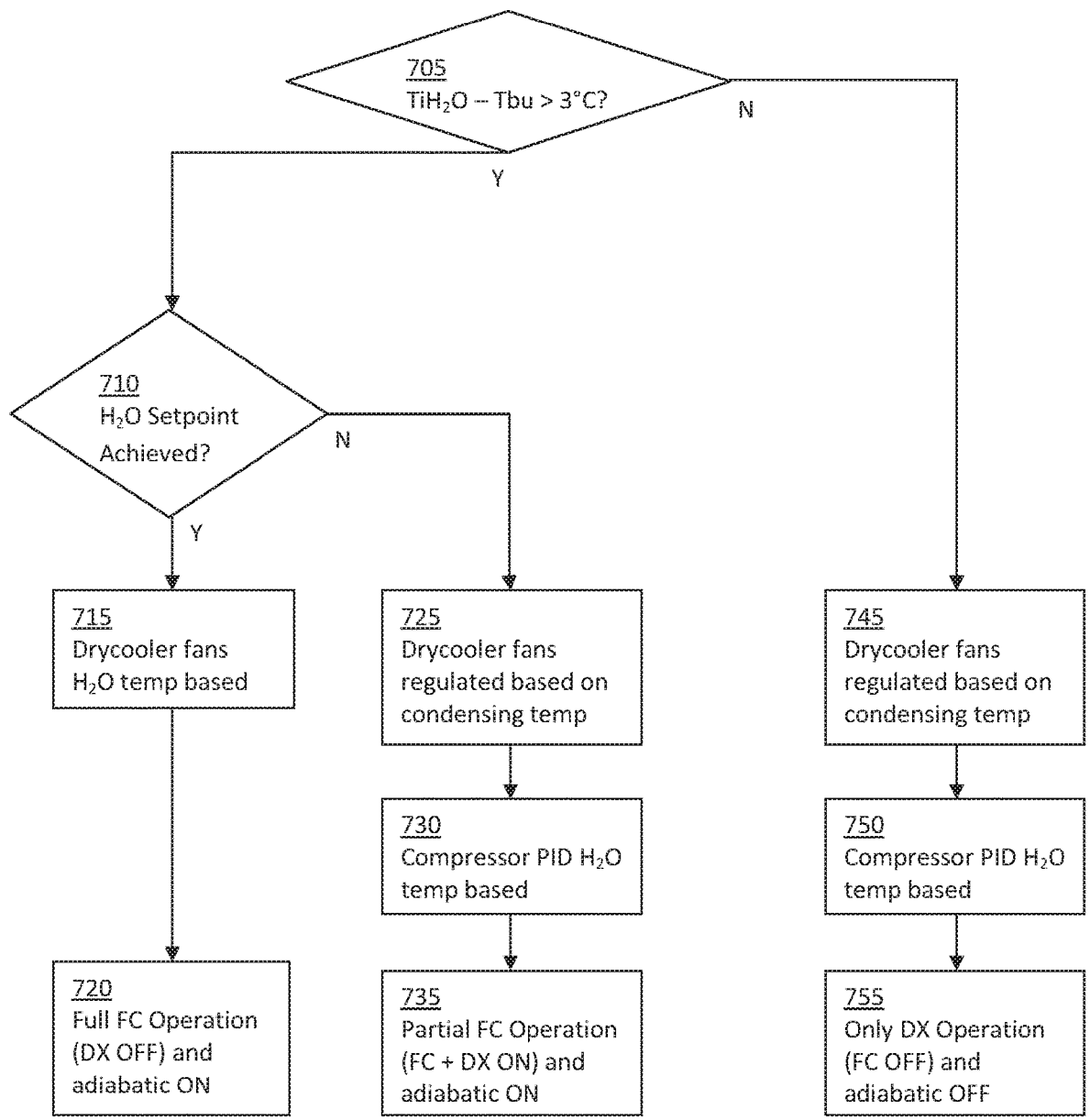
FIG. 17B illustrates a second partial flowchart of a method of operating a data center cooling system.

A method by which the controller may determine and control which drycooler modules 410 and chiller modules 420 are in operation is illustrated in the flowchart in FIGS. 17A and 17B. In act 605 a comparison is made between the dry bulb ambient air temperature Tbs measured by a dry bulb thermometer of the system and the wet bulb ambient air temperature Tbu measured by a wet bulb thermometer of the system. If the dry bulb temperature is at least five degrees Celsius higher than the wet bulb temperature, this is an indication that the ambient air is sufficiently dry (not too humid) such that adiabatic cooling (a process of precooling of air used to cool down the heat exchanger coils which water or refrigerant are passing through by evaporating water) may be efficiently utilized. If the ambient air is sufficiently dry such that adiabatic cooling may be efficiently utilized, the flowchart proceeds to act 705 in FIG. 17B.

If it is determined that adiabatic cooling should not be utilized the method proceeds to act 620 in which the temperature of water at the inlet of the cooling system (TiH$_2$O) is compared to the dry bulb ambient air temperature. If the difference between the temperature of water at the inlet of the cooling system is at least three degrees Celsius greater than the dry bulb ambient air temperature, the method proceeds to act 625 where the temperature of the cooling water at the inlet of the data center is checked to determine if it is cool enough, e.g., at or below the cooling water temperature setpoint. If the cooling water is at or below the cooling water temperature setpoint, then the cooling system does not require the use of the chiller modules 420 (DX OFF) and runs in free cooling mode only (act 635) in which the fans of the drycooler modules 410 are adjusted as needed, for example, with a proportional-integral-derivative (PID) controller to maintain the cooling water at the inlet of the data center at or below the cooling water temperature setpoint (act 630).

If the temperature of the cooling water at the inlet of the data center is determined to be above the cooling water temperature setpoint in act 625, the cooling system operates in mixed mode in which the drycooler modules 410 are operated at maximum rated fan speed at one or more chiller modules 420 are also activated (act 650). The fans of the drycooler modules 410 are controlled, for example, with a PID controller based on the condensing temperature—the temperature at which liquification of compressed vapor from gas to liquid happens in the condensers 420B of the chiller modules 420 (act 640), or in other embodiments, set to their maximum rated speed, and the compressors of the chiller modules 420 are controlled, for example, with a PID controller based on the temperature of the cooling water (act 645) entering the data center. In some embodiments, the chiller modules 420 are activated one at a time, until the temperature of the cooling water at the inlet of the data center reaches the cooling water temperature setpoint. If the temperature of the cooling water at the inlet of the data center drops below the cooling water temperature setpoint by a certain predetermined value under the setpoint value, one or more of the chiller modules 420 may be deactivated until the cooling water at the inlet of the data center rises to the cooling water temperature setpoint.

If in act 620 it is determined that the difference between the temperature of water at the inlet of the cooling system is not at least three degrees Celsius greater than the dry bulb ambient air temperature, the cooling system operates in full mechanical mode utilizing the chiller modules 420, but not the drycooler modules 410 (act 665). The fans of the drycooler modules 410 are controlled, for example, with a PID controller based on the condensing temperature (act 655), or in other embodiments, set to their maximum rated speed, and the fans of the compressors of the chiller modules 420 are controlled, for example, with a PID controller based on the temperature of the cooling water entering the data center (act 660). In some embodiments, the chiller modules 420 are activated one at a time, until the temperature of the cooling water at the inlet of the data center reaches the cooling water temperature setpoint. If the temperature of the cooling water at the inlet of the data center drops below the cooling water temperature setpoint, for example, by about three degrees Celsius, one or more of the chiller modules 420 may be deactivated until the cooling water at the inlet of the data center rises to the cooling water temperature setpoint.

If, in act 610, it is determined that adiabatic cooling should be utilized, the method proceeds to act 705 in FIG. 7B in which the temperature of water at the inlet of the cooling system is compared to the wet bulb ambient air temperature. If the difference between the temperature of water at the inlet of the cooling system is at least three degrees Celsius greater than the wet bulb ambient air temperature, the method proceeds to act 710 where the temperature of the cooling water at the inlet of the data center is checked to determine if it is cool enough, e.g., at or below the cooling water temperature setpoint. If the cooling water is at or below the cooling water temperature setpoint, then the cooling system does not require the use of the chiller modules 420 and runs in free cooling mode with the addition of adiabatic cooling (act 720) in which the fans of the drycooler modules 410 are adjusted as needed, for example, with a proportional-integral-derivative (PID) controller to maintain the cooling water at the inlet of the data center at or below the cooling water temperature setpoint (act 715). The chiller modules 420 are not utilized.

If the temperature of the cooling water at the inlet of the data center is determined to be above the cooling water temperature setpoint in act 710, the cooling system operates in mixed mode in which the drycooler modules 410 are operated at maximum rated fan speed at one or more chiller modules 420 are also activated and adiabatic cooling is used (act 735). The fans of the drycooler modules 410 are controlled, for example, with a PID controller based on the condensing temperature (act 725), or in other embodiments, set to their maximum rated speed, and the compressors of the chiller modules 420 are controlled, for example, with a PID controller based on the temperature of the cooling water entering the data center (act 730). In some embodiments, the chiller modules 420 are activated one at a time, until the temperature of the cooling water at the inlet of the data center reaches the cooling water temperature setpoint. If the temperature of the cooling water at the inlet of the data center drops below the cooling water temperature setpoint by a predetermined value under the set point value one or more of the chiller modules 420 may be deactivated until the cooling water at the inlet of the data center rises to the cooling water temperature setpoint.

If in act 705 it is determined that the difference between the temperature of water at the inlet of the cooling system is not at least three degrees Celsius greater than the wet bulb ambient air temperature, the cooling system operates in full mechanical mode utilizing the chiller modules 420, but not the drycooler modules 410 (act 755). The fans of the drycooler modules 410 are controlled, for example, with a PID controller based on the condensing temperature (act 745), or in other embodiments, set to their maximum rated speed, and the fans of the compressors of the chiller modules 420 are controlled, for example, with a PID controller based on the temperature of the cooling water entering the data center (act 750). In some embodiments, the chiller modules 420 are activated one at a time, until the temperature of the cooling water at the inlet of the data center reaches the cooling water temperature setpoint. If the temperature of the cooling water at the inlet of the data center drops below the cooling water temperature setpoint by a predetermined value under the set point value one or more of the chiller modules 420 may be deactivated until the cooling water at the inlet of the data center rises to the cooling water temperature setpoint.

Having thus described several aspects of at least one embodiment of this invention, it is to be appreciated various alterations, modifications, and improvements will readily occur to those skilled in the art. Any feature described in any embodiment may be included in or substituted for any feature of any other embodiment. Such alterations, modifications, and improvements are intended to be part of this disclosure, and are intended to be within the scope of the invention. Accordingly, the foregoing description and drawings are by way of example only.

What is claimed is:

1. A modular chiller system comprising:
 a switching and pumping module;
 one or more drycooler modules; and
 one or more chiller modules,
 the switching and pumping module, the one or more drycooler modules, and the one or more chiller modules sharing same water interfaces, power interfaces, and signal interfaces, providing for cooling capacity of the modular chiller system to be increased by adding drycooler modules or chiller modules without additional hydraulic and electrical infrastructure, the water interfaces of the switching and pumping module providing for hydraulic connection to a first set of water interfaces of the one or more drycooler modules, the water interfaces of the switching and pumping module being identical to a second set of water interfaces of the one or more drycooler modules.

2. The system of claim 1, further comprising fluid conduits configured and arranged to direct heated water from one or more condensers of the one or more chiller modules to the one or more drycooler modules.

3. The system of claim 2, wherein the one or more drycooler modules are configured to release heat from the heated water to the atmosphere.

4. The system of claim 1, configured to operate in an economizer-only mode in which the one or more drycooler modules are utilized to cool cooling water flowing through the system and the one or more chiller modules are not utilized, a mixed mode in which both the one or more drycooler modules and the one or more chiller modules are utilized to cool cooling water flowing through the system, and a full mechanical mode in which the one or more chiller modules are utilized to cool cooling water flowing through the system, the cooling water flowing through both the one or more drycooler modules and the one or more chiller modules in each of the economizer-only mode, the mixed mode, and the full mechanical mode.

5. The system of claim 1, wherein the power interface of the switching and pumping module provides for electrical connection to a first power interface of the one or more drycooler modules, the power interface of the switching and pumping module being identical to a second power interface of the one or more drycooler modules.

6. The system of claim 1, wherein the signal interface of the switching and pumping module provides for electrical communication with a first signal interface of the one or more drycooler modules, the signal interface of the switching and pumping module being identical to a second signal interface of the one or more drycooler modules.

7. The system of claim 1, wherein the switching and pumping module includes water interfaces providing for hydraulic connection to a first set of water interfaces of the one or more chiller modules, the water interfaces of the switching and pumping module being identical to a second set of water interfaces of the one or more chiller modules.

8. The system of claim 1, wherein the power interface of the switching and pumping module provides for electrical connection to a first power interface of the one or more chiller modules, the power interface of the switching and pumping module being identical to a second power interface of the one or more chiller modules.

9. The system of claim 1, wherein the signal interface of the switching and pumping module provides for electrical communication with a first signal interface of the one or more chiller modules, the signal interface of the switching and pumping module being identical to a second signal interface of the one or more chiller modules.

10. The system of claim 1, wherein the one or more chiller modules include a first set of water interfaces providing for hydraulic connection to the switching and pumping module and a second set of water interfaces providing for hydraulic connection between the one or more chiller modules and a terminator unit including a regulation valve configured to control a pressure differential between collectors of the terminator unit and maintain a set pressure differential through one of condensers and evaporators of the one or more chiller modules.

11. The system of claim 10, wherein the terminator unit is hydraulically connected to the one or more chiller modules.

12. The system of claim 1, including a cooling water loop that passes through each of the one or more drycooler modules and one or more chiller modules.

13. The system of claim 1, wherein the switching and pumping module controls a flow of water to both the one or more drycooler modules and the one or more chiller modules.

14. A modular chiller system comprising:
 a switching and pumping module;
 one or more drycooler modules; and
 one or more chiller modules,
 the switching and pumping module, the one or more drycooler modules, and the one or more chiller modules sharing same water interfaces, power interfaces, and signal interfaces, providing for cooling capacity of the modular chiller system to be increased by adding drycooler modules or chiller modules without additional hydraulic and electrical infrastructure, the water interfaces of the switching and pumping module providing for hydraulic connection to a first set of water interfaces of the one or more chiller modules, the water interfaces of the switching and pumping module being identical to a second set of water interfaces of the one or more chiller modules.

15. A modular chiller system comprising:
 a switching and pumping module;
 one or more drycooler modules; and
 one or more chiller modules, the one or more chiller modules including a first set of water interfaces providing for hydraulic connection to the switching and pumping module and a second set of water interfaces providing for hydraulic connection between the one or more chiller modules and a terminator unit including a regulation valve configured to control a pressure differential between collectors of the terminator unit and maintain a set pressure differential through one of condensers and evaporators of the one or more chiller modules,
 the switching and pumping module, the one or more drycooler modules, and the one or more chiller modules sharing same water interfaces, power interfaces, and signal interfaces, providing for cooling capacity of the modular chiller system to be increased by adding drycooler modules or chiller modules without additional hydraulic and electrical infrastructure.

* * * * *